(12) United States Patent
Tripsas et al.

(10) Patent No.: US 6,420,702 B1
(45) Date of Patent: Jul. 16, 2002

(54) NON-CHARGING CRITICAL DIMENSION SEM METROLOGY STANDARD

(75) Inventors: Nicholas H. Tripsas, San Jose; Bhanwar Singh, Morgan Hill; Michael K. Templeton, Atherton, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/611,641

(22) Filed: Jul. 7, 2000

(51) Int. Cl.$^7$ ............................................. H01J 37/28
(52) U.S. Cl. .................. 250/310; 250/307; 250/252.1; 257/48
(58) Field of Search ........................ 250/310, 307, 250/252.1; 257/45, 797

(56) References Cited

U.S. PATENT DOCUMENTS

| | | | | |
|---|---|---|---|---|
| 5,414,265 A | * | 5/1995 | Sartore | 250/310 |
| 5,434,409 A | * | 7/1995 | Tsubusaki | 250/307 |
| 5,637,186 A | * | 6/1997 | Liu et al. | 438/14 |
| 5,977,542 A | * | 11/1999 | Singh et al. | 250/307 |
| 6,048,743 A | * | 4/2000 | Yang et al. | 438/14 |
| 6,057,171 A | * | 5/2000 | Chou et al. | 438/15 |
| 6,137,175 A | * | 10/2000 | Tabara | 257/750 |
| 6,215,129 B1 | * | 4/2001 | Harvey et al. | 257/48 |

* cited by examiner

*Primary Examiner*—Kiet T. Nguyen
(74) *Attorney, Agent, or Firm*—Gerald Fisher; Deborah Wenocur

(57) ABSTRACT

An SEM measurement standard for measuring linewidths of 0.1 microns and below utilizes two different conducting materials in order to prevent charging effects. The top material is selected to use grain morphology to focus secondary electrons, and to obtain improved image contrast. The inventive standard is comprised of materials which are commonly used in semiconductor manufacturing and which do not cause contamination of fabrication facilities.

22 Claims, 4 Drawing Sheets

NON-CHARGING CRITICAL DIMENSION SEM METROLOGY STANDARD

FIELD OF THE INVENTION

This invention deals with metrology standards, and in particular with metrology standards as applied to Scanning Electron Microscopy used for measurement of Critical Dimensions (CD's) in integrated circuit manufacturing technology.

BACKGROUND OF THE INVENTION

As integrated circuits become smaller and faster, the critical dimensions (CD's) of the devices and interconnections also must decrease. As these CD's get closer to the resolution limits of optical lithography and microscopy measurement techniques, great care must be taken to eliminate all possible sources of measurement error in order to obtain accurate and reproducible critical dimensions. One nearly universally used measurement technique is Scanning Electron Microscopy (SEM), which utilizes highly focused energetic beams of electrons impinging on the sample and measures the yield of secondary emitted electrons. SEM is the most widely used tool for VLSI measurement and morphology analysis, due to its high resolution and relative ease of use.

FIG. 1 depicts an SEM system, showing the electron source and the acceleration, focusing, and detection electronics. FIG. 2 shows a typical electron emission energy spectrum resulting from the incident electron beam of an SEM. The highest energy peak 18 results from the back-scattered electrons, which have energies close to that of the incident beam, and which have undergone only elastic collisions with the target atoms. Peaks 20 seen at intermediate energies are the Auger electrons emitted due to relaxation of electrons between atomic energy levels. The lowest energy emitted electrons 22, produced by inelastic collisions between the primary beam and the inner shell electrons of the sample, are known as the secondary electrons and are generally the most useful for morphology studies in VLSI. This is due in part to the extremely short escape depth (less than about 50 Angstroms) of secondary electrons, which yields high surface sensitivity. In addition, since the incident electron beam undergoes beam broadening due to multiple collisions as it penetrates into the sample, the backscattered electrons originating from deeper into the sample reflect this broadening with degraded point-to-point resolution. The lower energy secondary electrons which escape the sample originate from the surface region above the penetration depth where beam broadening becomes influential, and therefore yield higher point-to-point resolution than evidenced by backscattered electrons.

The detected electron current, typically chosen to be the secondary electron current as described above, is used to intensity modulate the z-axis of a CRT. An image of the sample surface is produced by synchronously raster scanning the CRT screen and the electron beam of the SEM.

The contrast of the image depends on variations in the electron flux arriving at the detector, and is related to the yield of emitted electrons per incident electron. The yield is dependent on both the work function of the material and the surface curvature. These factors allow the SEM to distinguish between materials such as metal, oxide, and silicon, and also to distinguish surfaces which differ in slope. Thus, Critical Dimensions (CD's) of patterned and/or etched lines and gaps can be measured.

Two factors affecting the accuracy of SEM measurements are resolution and charging effects. The resolution of the SEM depends on the type of sample under inspection and on the incident beam diameter or "spot size". The high voltages of the electron beam required to produce small scanning spot sizes were historically one source of charging when examining insulating surfaces. When incident beam energies exceeded the secondary electron crossover point, i.e., when the incident beam penetration depth was high enough that the number of emitted secondary electrons was less than the number of incident electrons, the surface in the region of the scanning beam would acquire excess negative charge, which would be retained in the case of exposed insulating surfaces. This would cause the incident beam trajectory to be disturbed, and would therefore degrade the image. Grounding schemes such as coating the surface with a conducting material, e.g., gold, and attaching a ground wire to the coating were used to reduce charging effects. These methods prohibited further processing following inspection of wafers. More recent SEM machines have eliminated high energy accelerating voltages, thus decreasing the corresponding charging effects. However, these low voltage SEM's have poorer resolution (approximately 40–50 Å resolution for 600 V SEM) than the corresponding high-voltage SEM's (approximately 5–10 Å for 20–50 KV SEM). Charging of insulating surfaces can result from factors other than the SEM electron beam, such as processing-induced charging.

Calibration standards are necessary when using SEM's, in order to assure that magnification factors are accurate and to thereby assure accurate sizes as measured by SEM photographs. Conductor-coated (generally gold-coated) standard samples with features measured to high accuracy are still used to calibrate, i.e., to verify CD's and spacings as measured in low-voltage SEM's. Although this method is one way of producing measurement standards, it has the disadvantage of degrading image contrast, since the underlying layers are partially obscured by the conducting coating. Additionally, gold-coated standards cannot be used in fabrication facilities since the presence of gold incurs the risk of drastically lowering the carrier lifetime in silicon.

If measurement standards having exposed insulating layers are used without a conducting coating in order to achieve maximum contrast, variations in charging will induce variations in measurement, and therefore the calibration standard will drift as a function of time.

In order to achieve a calibration standard which will be effective for measuring linewidths less than 0.1 microns, for polysilicon by way of example, it is beneficial that the standard have a grainy structure at the top surface of the features (which provides focus improvement for the e-beam) while not being grainy on the feature sidewalls (which would result in measurement variations along the line), that the standard has a vertical and smooth sidewall profile, that it can be patterned as finely as the linewidths being measured, that it is not susceptible to charging effects, and that it yields good image contrast. Currently available SEM standards do not fulfill these requirements, and in particular are generally subject to significant charging effects.

SUMMARY OF THE INVENTION

It is therefore an object of this invention to provide an improved SEM measurement standard which is not subject to surface charging.

It is a further object of this invention to provide an improved SEM measurement standard which improves image contrast and e-beam focus.

It is a further object of this invention to provide an improved SEM measurement standard which can be patterned to linewidths of 0.1 microns or less, with vertical and smooth sidewall profile.

These objects are met by creating an SEM measurement standard having two different conducting layers comprised of materials used in semiconductor fabrication.

DETAILED DESCRIPTION OF THE INVENTION

Figure 1:
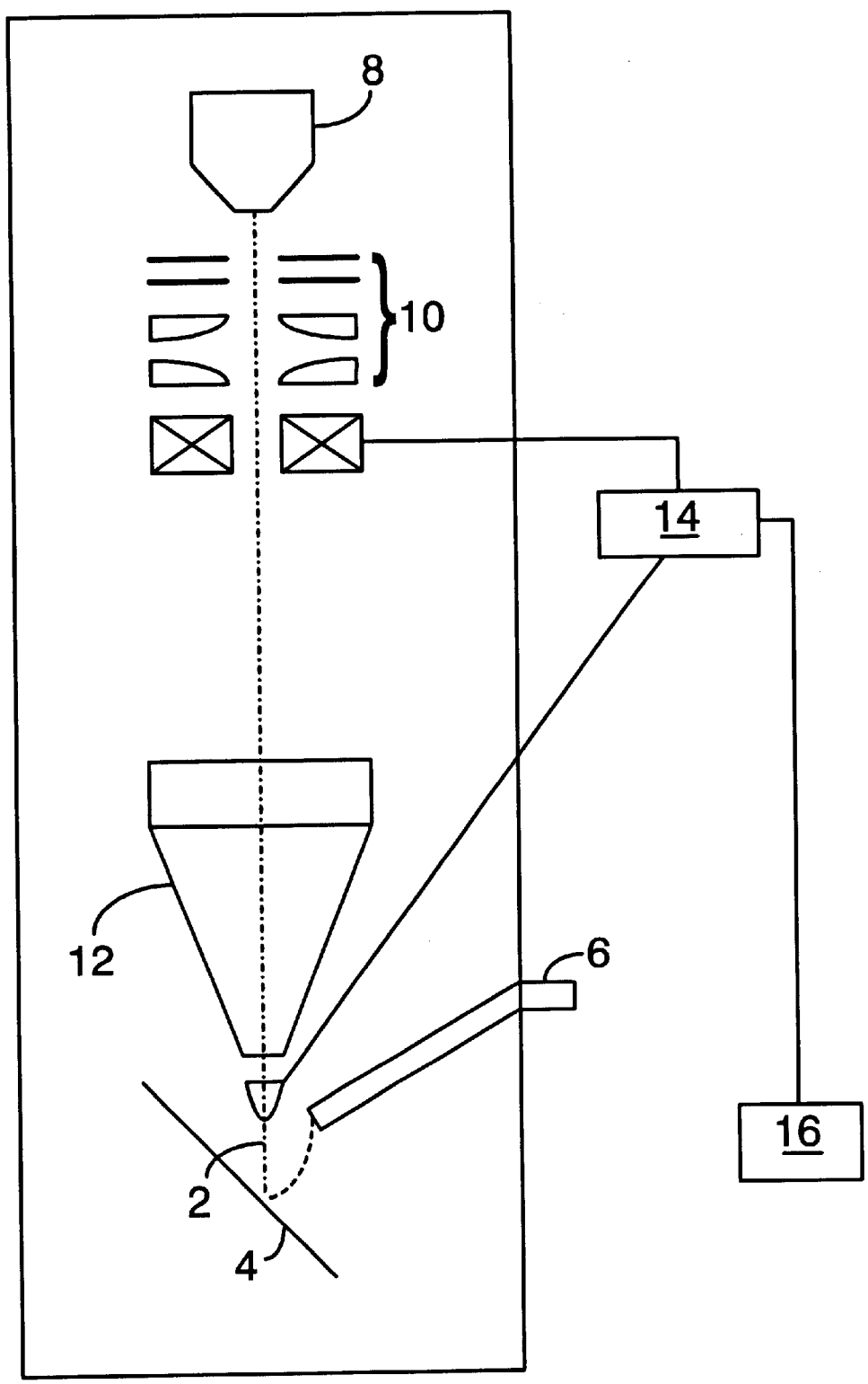
FIG. 1 depicts an SEM system, showing the electron source and the acceleration, focusing, and detection electronics.

FIG. 1 is a schematic diagram of an SEM system, showing incident electron beam 2 impinging on sample 4. The secondary electrons are collected and detected at detector 6. Electron beam source 8, accelerating and focusing electrodes 10, lens apparatus 12, scan control 14, and monitor 16 are also shown.

Figure 2:
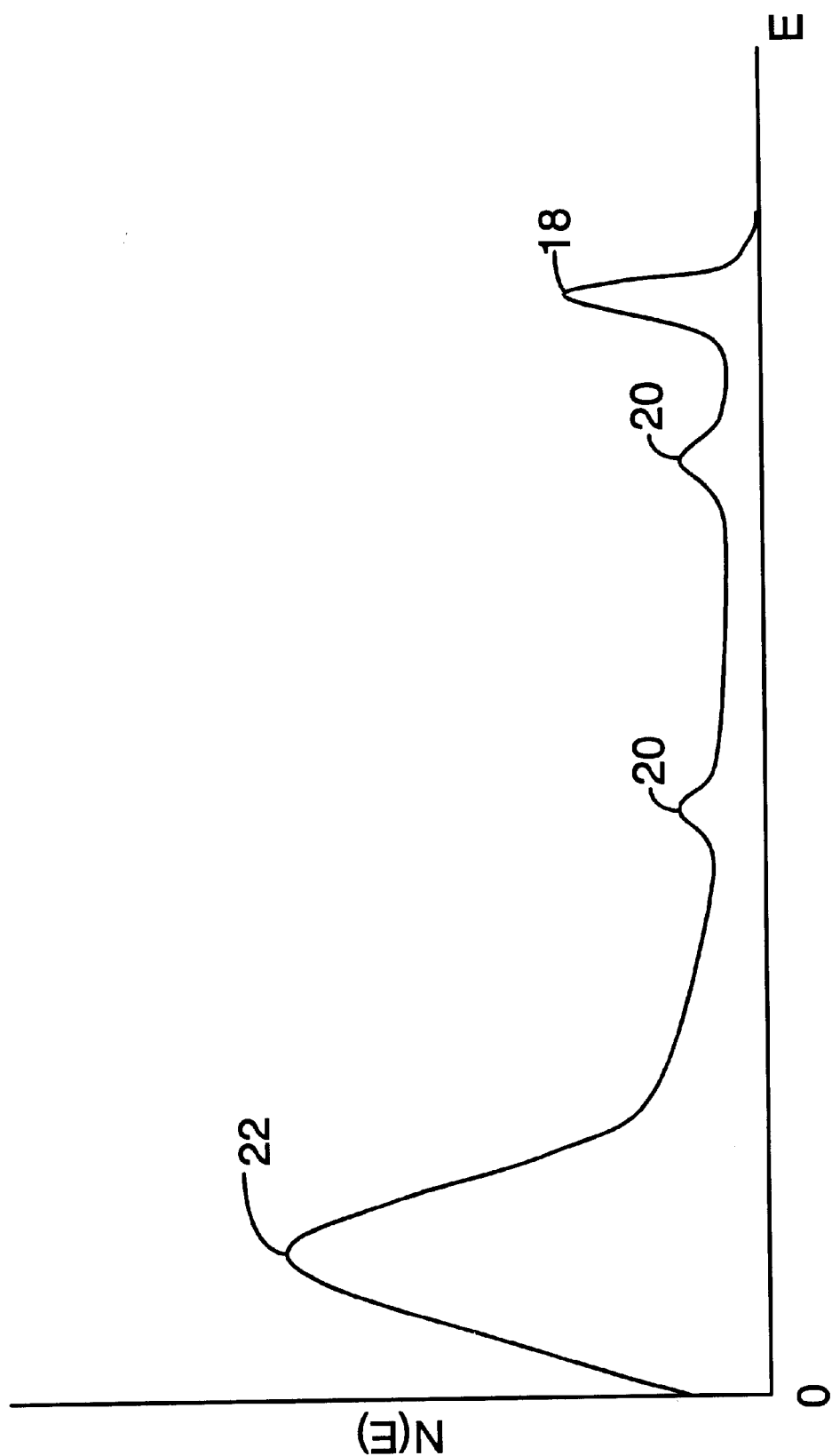
FIG. 2 is a typical electron emission energy spectrum resulting from the incident electron beam of an SEM.

FIG. 2 shows a representative spectrum of emitted electrons, including backscattering peak 18 at near the incident beam energy, Auger peaks 20, and secondary electron emission peak 22 at lower energy. In general, secondary electrons 22 are those detected for the SEM's.

The inventive SEM measurement standard structure is comprised of two different conducting layers having different conductivity and/or density and thereby having different appearance in SEM photographs. As a result, good image contrast is achieved while the problem of surface charging is solved. The conducting layers are preferably composed of materials which are already used and accepted within fabrication areas. This would allow fabs to build their own verification standards using their existing processing equipment and mask sets, thereby eliminating cross contamination risk which would occur from commercially produced standards.

In a preferred embodiment of the invention a tungsten silicide ($WSi_x$) feature is patterned on a titanium or titanium nitride layer on a silicon wafer according to the following process flow:

Step 24 Provide a silicon substrate

Step 26 Deposit or grow a silicon dioxide layer thereon (by industry standard processes such as thermal oxidation, LPCVD, or PECVD by way of example), preferably of thickness greater than 500 A, to promote adhesion of titanium and to prevent a chemical reaction between titanium and silicon. The silicon dioxide layer must have a thickness of sufficient magnitude to prevent titanium-silicon reduction reactions from penetrating through the silicon dioxide. The minimum thickness depends on the thickness of the Ti layer.

Step 28 Deposit by sputtering or chemical vapor deposition a Ti or TiN layer of sufficient thickness to serve as an etch stop for $WSi_x$ etch, preferably between 500 and 5000 A thickness Step 30 Deposit by chemical vapor deposition a $WSi_x$ film which can be patterned with high fidelity, preferably between 500 and 3000 A thickness Step 32 Pattern and etch the $WSi_x$ film, stopping on the underlying Ti or TiN film, using standard deep-UV photoresist lithography and plasma etch techniques.

Figure 3:
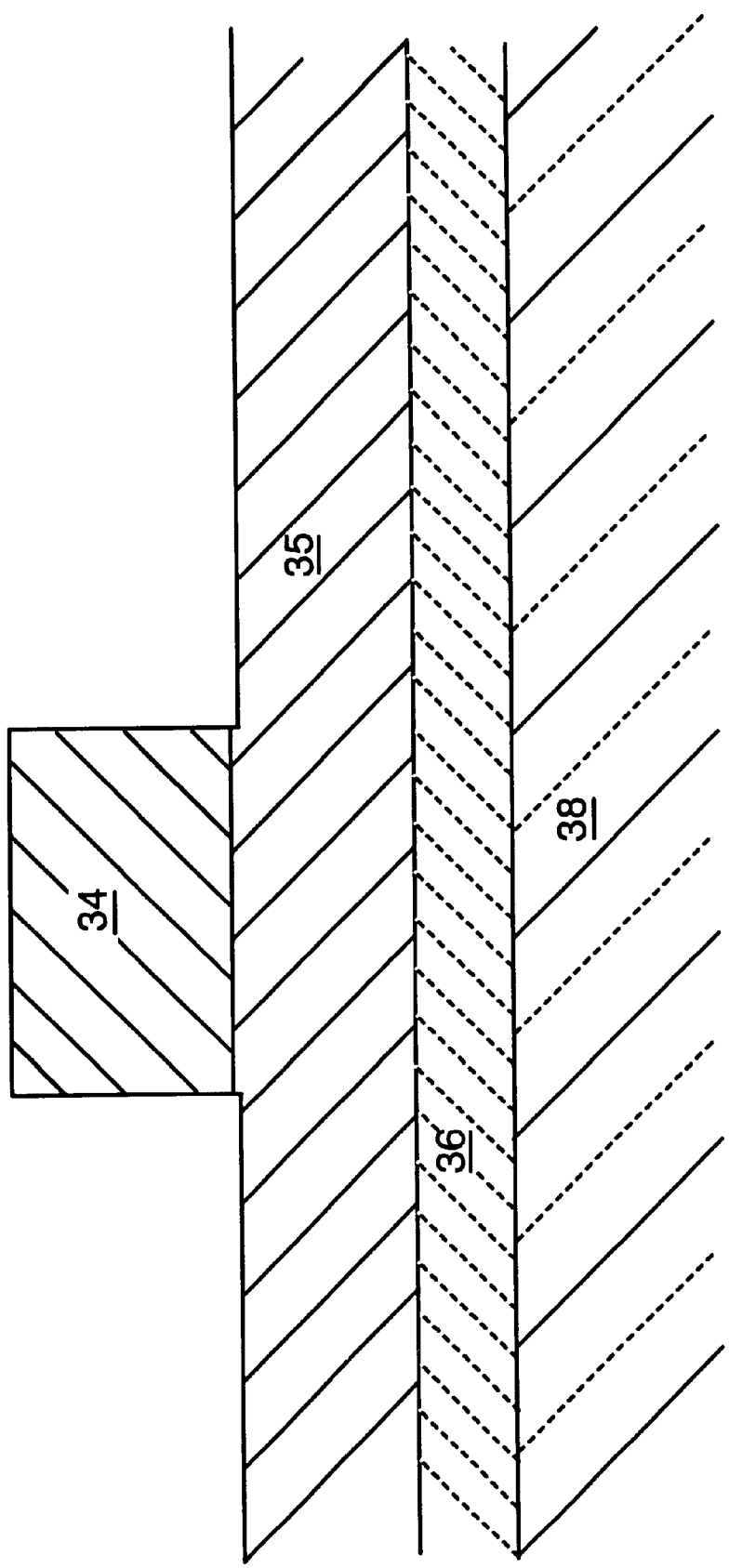
FIG. 3 shows the inventive structure for an SEM measurement standard.

The resulting structure is shown in cross section in FIG. 3. Patterned and etched $WSi_x$ feature 34 is shown atop Ti or TiN film 35, with oxide layer 36 underlying, and silicon substrate 38.

Structures included on the SEM standard include but are not restricted to: 1) L-shaped patterns; 2) equal lines/spaces; 3) isolated lines; 4) isolated spaces; 5) dense spaces; 6) dense and isolated contact holes.

Figure 4A:
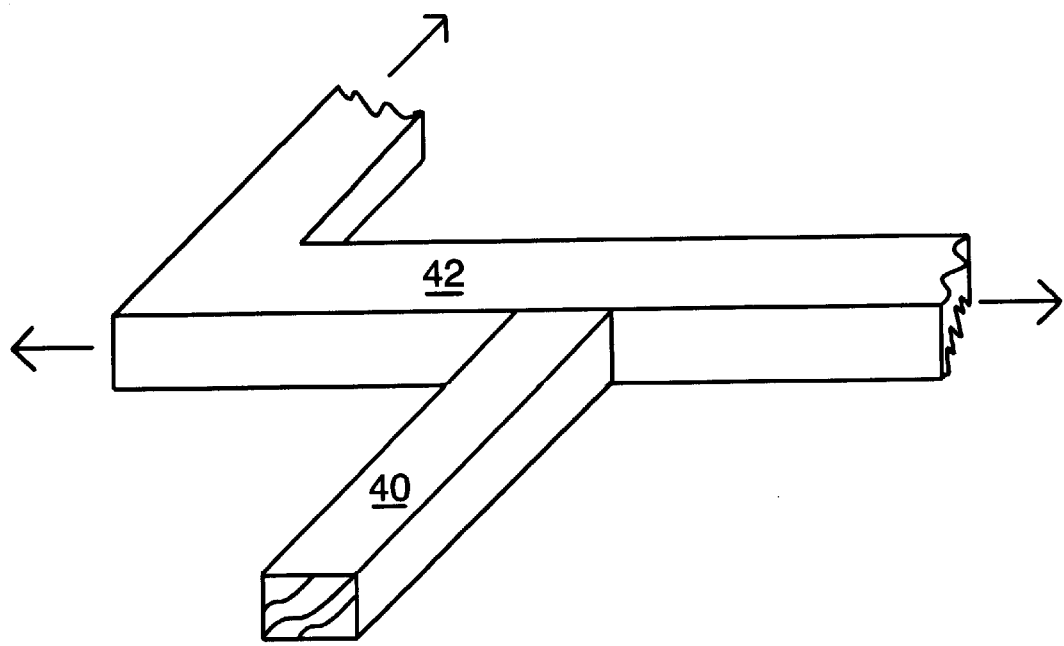
FIG. 4a illustrates an isolated line according to a second embodiment of the invention.
Figure 4B:
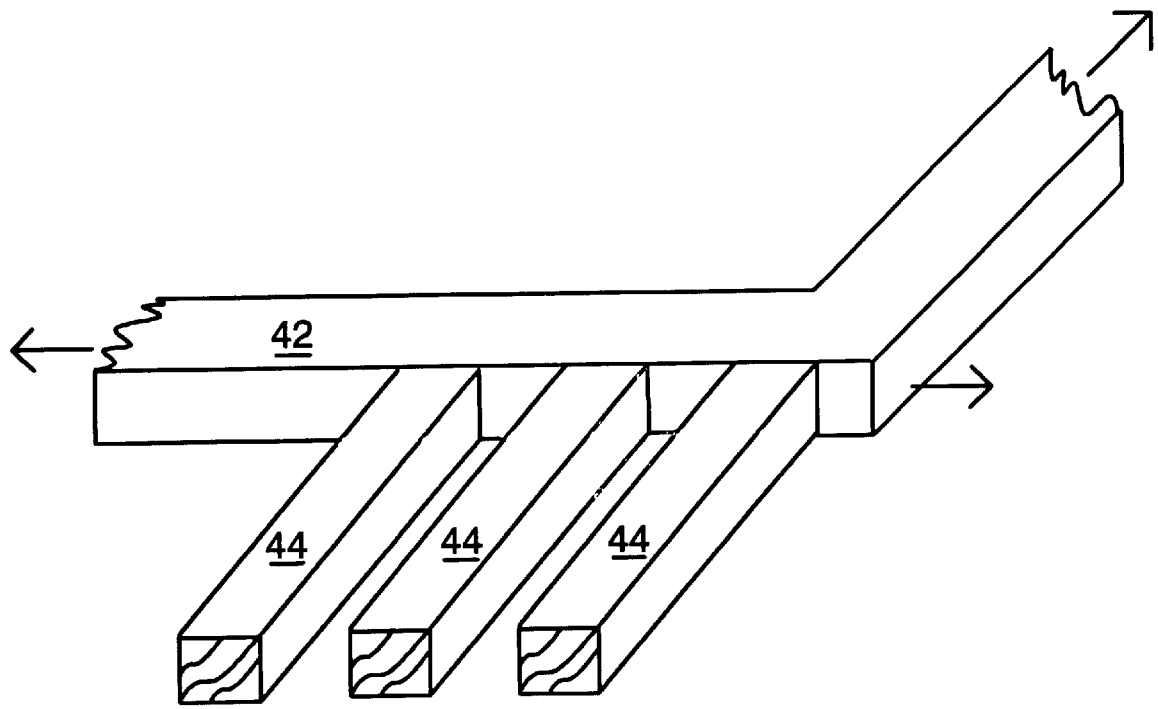
FIG. 4b illustrates dense lines according to the second embodiment of the invention.

A second embodiment of the invention further decreases charging effects by connecting all metal features to dissipate any local charge buildup. FIG. 4a shows an example of an isolated line feature according to this embodiment. Isolated $WSi_x$ line 40 is connected at one end to interconnection lines 42 (also formed of $WSi_x$) traverse the standard and which are also connected to the other features on the standard. FIG. 4b similarly shows dense $WSi_x$ lines 44 connected to interconnection lines 42.

$WSi_x$ features atop Ti or TiN nitride provide good image contrast, good grain morphology for focusing the e-beam at the best imaging conditions, and are not subject to surface charging, therefore exhibiting stability over time. The inventive SEM $WSi_x$/Ti[N] standard structure is comprised of materials commonly used in semiconductor processing, with well developed deposition and etch processes already in place in the art to permit patterning of features equivalent in width and critical dimension to polysilicon gate dimensions.

Although the inventive structure is described herein according to the preferred embodiment, it will be clear to those skilled in the art that variations of the described structure and process flow may be used without departing from the inventive concept. For example, Ta or $TaN_x$ might be used in place of Ti and TiN. $WSi_x$ might be replaced by W or heavily doped polysilicon. Other possible materials commonly used in fabrication facilities which might be utilized include nickel, aluminum, cobalt, platinum, and their suicides.

The scope of the invention should be construed in view of the claims.

With this in mind, we claim:

1. A Critical Dimension measurement system comprising:
    a) a Scanning Electron Microscope providing, in operation, a scanning electron beam;
    b) a measurement standard comprising:
        (1) a substrate;
        (2) a first conducting layer composed of a first conducting material on top of said substrate;
        (3) a second patterned conducting layer composed of a second conducting material on top said first conducting layer, said second conducting layer having a top surface and side surfaces and further comprising lines and spaces therebetween, said second conducting material having a grainy structure on said top surface and not having a grainy structure on said side surfaces;
        (4) said first and second conducting materials being standard materials used in integrated circuits;
    c) said measurement standard being positioned in said electron beam.

2. The measurement system of claim 1, wherein said first conducting material is chosen from the group consisting of titanium, titanium nitride, tantalum, and tantalum nitride;
    and wherein said second conducting material is chosen from the group consisting of W, nickel, aluminum, cobalt, platinum, the suicides thereof, and doped polysilicon.

3. The measurement standard of claim 2, wherein said first conducting material is titanium or titanium nitride, and said second conducting material is tungsten silicide.

4. The measurement standard of claim 3, wherein said first conducting layer has a thickness in the range between 500 and 5000 A and said second conducting layer has a thickness in the range between 500 and 3000 A.

5. The measurement standard of claim 4, wherein said lines and spaces have critical dimensions less than 0.1 microns.

6. The measurement standard of claim 2, further comprising an adhesion/barrier layer between said substrate and said first conducting film.

7. The measurement standard of claim 6, wherein said substrate is silicon and said adhesion/barrier layer is silicon dioxide.

8. The critical dimension measurement system of claim 2, wherein said measurement standard further includes an adhesion/barrier layer directly on said substrate;
said first conducting layer being on top of said adhesion/barrier layer.

9. The critical dimension measurement system of claim 8, wherein:
said first conducting material is titanium or titanium nitride, and said second conducting material is tungsten silicide.

10. The critical dimension measurement system of claim 8, wherein:
said first conducting material has a thickness in the range between 500 and 5000 A and said second conducting material has a thickness in the range between 500 and 3000 A.

11. The critical dimension measurement system of claim 10, wherein said lines and spaces have critical dimensions less than 0.1 microns.

12. The Critical Dimension measurement system of claim 1,
wherein said first conducting material is chosen from the group consisting of titanium, titanium nitride, tantalum, and tantalum nitride;
and wherein said second conducting material is chosen from the group consisting of W, nickel, aluminum, cobalt, platinum, the silicides thereof, and heavily doped polysilicon.

13. The measurement system of claim 12, wherein said first conducting material is titanium or titanium nitride, and said second conducting material is tungsten silicide.

14. The measurement standard of claim 13, wherein said first conducting layer has a thickness in the range between 500 and 5000 A and said second conducting layer has a thickness in the range between 500 and 3000 A.

15. The measurement standard of claim 14, wherein said lines and spaces have critical dimensions less than 0.1 microns.

16. The Critical Dimension measurement system of claim 12, further comprising:
an adhesion/barrier layer directly on said substrate;
said first conducting layer composed of a first conducting material being on top of said adhesion/barrier layer.

17. The measurement system of claim 16, wherein said first conducting material is titanium or titanium nitride, and said second conducting material is tungsten silicide.

18. The measurement standard of claim 17, wherein said first conducting layer has a thickness in the range between 500 and 5000 A and said second conducting layer has a thickness in the range between 500 and 3000 A.

19. The measurement standard of claim 18, wherein said lines and spaces have critical dimensions less than 0.1 microns.

20. The measurement standard of claim 16, wherein all said lines in said second conducting layer are interconnected.

21. In a Scanning Electron Microscope, THE IMPROVEMENT COMPRISING:
a critical dimension measurement standard positioned in said Scanning Electron Microscope to receive an incident electron beam, said measurement standard comprising:
a substrate;
an adhesion barrier layer directly on said substrate;
a first conducting layer composed of a first conducting material on top of said adhesion/barrier layer;
a second patterned conducting layer composed of a second conducting material on top of said first conducting layer, said second conducting layer having a top surface and side surfaces and further comprising lines and spaces therebetween, said second conducting material having a grainy structure on said top surface and not having a grainy structure on said side surfaces;
said first and second conducting materials being standard materials used in integrated circuits;
wherein said first conducting material is chosen from the group consisting of titanium, titanium nitride, tantalum, and tantalum nitride;
and wherein said second conducting material is chosen from the group consisting of W, nickel, aluminum, cobalt, platinum, the silicides thereof, and doped polysilicon.

22. A method for calibrating the measurement of critical dimensions of features in semiconductor processing comprising the steps of:
providing a semiconductor substrate;
forming an adhesion/barrier layer directly on said substrate;
forming a first conducting layer composed of a first conducting material on top of said adhesion/barrier layer;
forming a second patterned conducting layer composed of a second conducting material on top of said first conducting layer, said second conducting layer having a top surface and side surfaces and further comprising lines and spaces therebetween, said second conducting material having a grainy structure on said top surface and not having a grainy structure on said side surfaces;
said first and second conducting materials being standard materials used in integrated circuits;
wherein said first conducting material is chosen from the group consisting of titanium, titanium nitride, tantalum, and tantalum nitride;
and wherein said second conducting material is chosen from the group consisting of W, nickel, aluminum, cobalt, platinum, the silicides thereof, and doped polysilicon;
said substrate with said first and second conducting materials thereon being a calibration standard;
thereafter installing said calibration standard in a scanning electron microscope;
scanning an electron beam from said scanning electron microscope across said calibration standard; and
measuring secondary electron emission from said calibration standard to determine dimensions of said lines and said spaces.

* * * * *